United States Patent
Wang et al.

(10) Patent No.: US 12,453,024 B2
(45) Date of Patent: Oct. 21, 2025

(54) LOCKING ASSEMBLY AND TERMINAL DEVICE

(71) Applicant: BEIJING XIAOMI MOBILE SOFTWARE CO., LTD., Beijing (CN)

(72) Inventors: Zehong Wang, Beijing (CN); Tao Yu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 508 days.

(21) Appl. No.: 17/957,612

(22) Filed: Sep. 30, 2022

(65) Prior Publication Data

US 2024/0008200 A1    Jan. 4, 2024

(30) Foreign Application Priority Data

Jun. 30, 2022   (CN) .......................... 202210770919.3

(51) Int. Cl.
*H05K 5/02* (2006.01)
*H05K 5/00* (2025.01)
*H05K 5/03* (2006.01)

(52) U.S. Cl.
CPC ............. *H05K 5/0221* (2013.01); *H05K 5/03* (2013.01); *H05K 5/0086* (2013.01); *H05K 5/0247* (2013.01)

(58) Field of Classification Search
CPC ....................................................... H05K 5/00
See application file for complete search history.

(56) References Cited

U.S. PATENT DOCUMENTS

2014/0306467 A1* 10/2014 Wollacott ............... E05C 17/46
                                                                    292/341.15
2021/0116978 A1*  4/2021 Yu ...................... H05K 7/20727

FOREIGN PATENT DOCUMENTS

| EP | 0886947 A1 | 12/1998 |
| EP | 3979608 A1 | 4/2022 |
| WO | WO 2022121936 A1 | 6/2022 |

OTHER PUBLICATIONS

European Patent Application No. 22197891.9, Search and Opinion dated Sep. 12, 2023, 11 pages.
European Patent Application No. 22197891.9, extended Search and Opinion dated Jun. 7, 2023, 12 pages.

* cited by examiner

*Primary Examiner* — Jerry Wu
(74) *Attorney, Agent, or Firm* — Cozen O'Connor

(57) ABSTRACT

A locking assembly includes a first structural member and a second structural member. The first structural member includes a first locking portion, and the second structural member includes a second locking portion. The second locking portion is separably locked with the first locking portion, to lock the first structural member with the second structural member and separate the first structural member from the second structural member.

13 Claims, 4 Drawing Sheets

LOCKING ASSEMBLY AND TERMINAL DEVICE

CROSS-REFERENCE TO RELATED APPLICATION

This application is based on and claims priority to the Chinese Patent Application No. 202210770919.3 filed on Jun. 30, 2022, the entire content of which is incorporated herein by reference for all purposes.

BACKGROUND

There are not only sealing members inside a terminal device, but also many electrically conductive members for electrical connection and grounding elastic sheets. The sealing members, the electrically conductive members and the grounding elastic sheets are located between two structural members, which are denoted as a first structural member (e.g., a middle frame) and a second structural member (e.g., a battery cover). The sealing members, the electrically conductive members and the grounding elastic sheets have a certain amount of compression in a working state, which creates a rebound force against the first structural member and the second structural member. In the related art, the two structural members are merely bonded by an entire loop of a double-sided adhesive, resulting in poor capability of locking the two structural members. A central area of the two structural members, such as an area of the second structural member inside the double-sided adhesive, is pushed up under the above-mentioned force, and the amount of compression of the sealing members, the electrically conductive members and the grounding elastic sheets is decreased, affecting signal and sealing effects of the terminal device, and diminishing the reliability and service performance of the terminal device.

SUMMARY

The present disclosure relates to the field of electronic apparatus, and more particularly, to a locking assembly and a terminal device incorporating the locking assembly.

A locking assembly according to a first aspect of the present disclosure includes a first structural member and a second structural member. The first structural member includes a first locking portion, and the second structural member includes a second locking portion. The second locking portion is separably locked with the first locking portion, to lock the first structural member with the second structural member and separate the first structural member from the second structural member.

A terminal device according to a second aspect of the present disclosure includes a locking assembly. The locking assembly includes a first structural member and a second structural member. The first structural member includes a first locking portion, and the second structural member includes a second locking portion. The second locking portion is separably locked with the first locking portion, to lock the first structural member with the second structural member and separate the first structural member from the second structural member.

DETAILED DESCRIPTION

Figure 1:
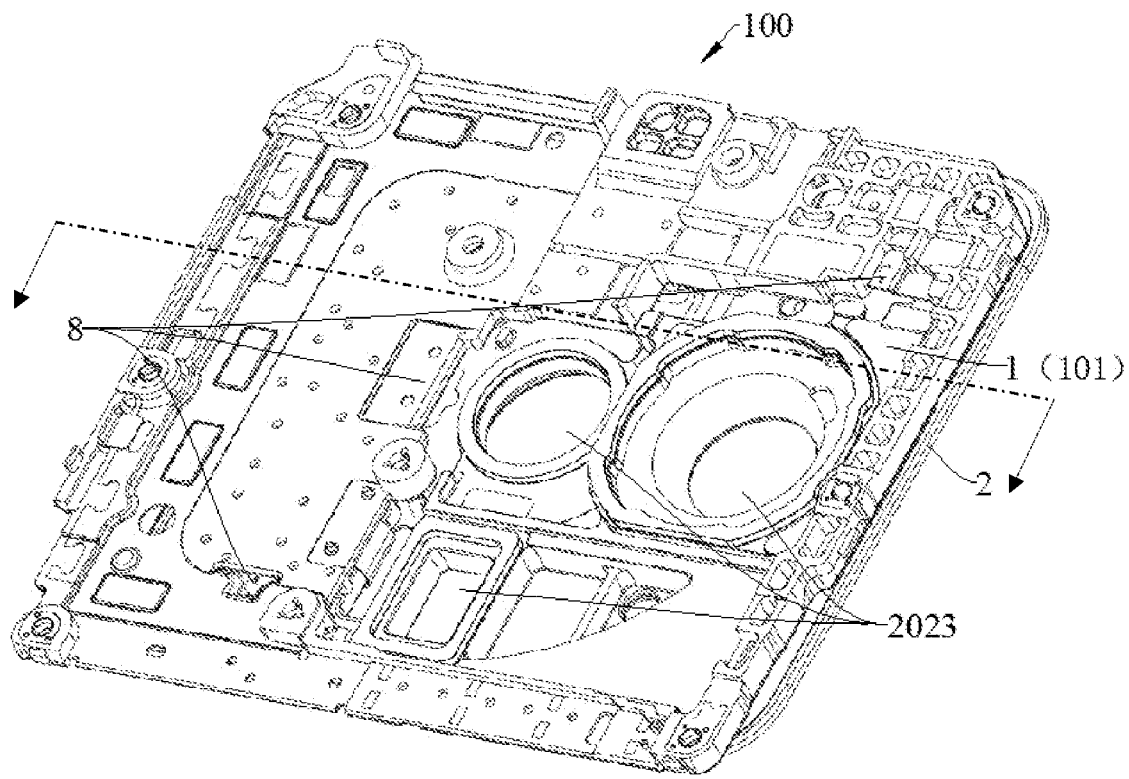
FIG. 1 is a partial perspective view of a locking assembly according to an embodiment of the present disclosure.

Embodiments of the present disclosure are described in detail below, and examples of the embodiments are shown in accompanying drawings. The following embodiments described with reference to the accompanying drawings are exemplary and are intended to explain the present disclosure rather than limit the present disclosure.

As shown in FIGS. 1 to 9, a locking assembly 100 according to embodiments of the present disclosure includes a first structural member 1 and a second structural member 2. The first structural member 1 includes a first locking portion 1011. The second structural member 2 includes a second locking portion 2021. The second locking portion 2021 separably locks with the first locking portion 1011, to lock the first structural member 1 with the second structural member 2 and separate the first structural member 1 from the second structural member 2.

The second locking portion 2021 separably locks with the first locking portion 1011, to lock the first structural member 1 with the second structural member 2 and separate the first structural member 1 from the second structural member 2. It can be understood as follows: when the second locking portion 2021 locks with the first locking portion 1011, the first structural member 1 is locked with the second structural member 2; when the second locking portion 2021 is separated from the first locking portion 1011, the first structural member 1 is separable from the second structural member 2.

For the locking assembly 100 according to the embodiments of the present disclosure, since the first structural member 1 and the second structural member 2 include the first locking portion 1011 and the second locking portion 2021, respectively, and the first locking portion 1011 separably locks with the second locking portion 2021, enhanced locking performance can be realized between the first structural member 1 and the second structural member 2. Compared with the related art in which the first structural member 1 and the second structural member 2 are merely bonded by a double-sided adhesive, the locking performance between the second structural member 2 and the first structural member 1 can be improved, reducing or even eliminating a phenomenon that the first structural member 1 and/or the second structural member 2 are pushed up by compressed sealing members, electrically conductive members or grounding elastic sheets. Hence, the signal stability and sealing effect of a terminal device having the locking assembly 100 can be improved, and the reliability and service performance of the terminal device having the locking assembly 100 can be enhanced.

The locking assembly 100 according to the embodiments of the present disclosure has advantages such as enhanced locking performance.

In some embodiments, the first structural member 1 includes a body and a bracket, the bracket is coupled to the body, and the first locking portion 1011 is on the bracket.

Since the first locking portion 1011 is on the bracket, the first locking portion 1011 can be prevented from affecting an original layout of components on the body, facilitating the design and manufacture of the first structural member 1.

In some embodiments, the body includes a middle frame, the bracket includes an antenna support 101, and the antenna support 101 is coupled to the middle frame. The first locking portion 1011 is on the antenna support 101. The second structural member 2 includes a battery cover, and the second locking portion 2021 is on the battery cover.

It can be understood that the antenna support 101 has some redundant space and redundant structures, the arrangement of the first locking portion 1011 on the antenna support 101 can fully utilize the redundant space and structures inside the terminal device without affecting the original layout inside the terminal device, which is conducive to reducing the design cost of the terminal device and improving the structural compactness of the terminal device.

In alternative embodiments, the first locking portion 1011 is directly on the middle frame.

In some embodiments, the middle frame includes a middle plate and an annular edge frame. The edge frame surrounds the middle plate, the antenna support 101 is coupled to the middle plate, and an edge of the battery cover is coupled to the edge frame.

For example, the edge of the battery cover is bonded to the edge frame by an entire loop of a double-sided adhesive. Both the first locking portion 1011 and the second locking portion 2021 are inside the entire loop of the double-sided adhesive. That is, an edge of the second structural member 2 is coupled to an edge of the first structural member 1, and a middle part of the second structural member 2 is locked with a middle part (the middle plate) of the first structural member 1 by the first locking portion 1011 and the second locking portion 2021.

Compared with the related art, a connection area between the second structural member 2 and the first structural member 1 is larger with more connection points. As a result, the locking performance between the second structural member 2 and the first structural member 1 can be effectively improved, reducing or even eliminating the phenomenon that the first structural member 1 and/or the second structural member 2 are pushed up by compressed sealing members, electrically conductive members or grounding elastic sheets. Hence, the reliability and service performance of the terminal device having the locking assembly 100 is further enhanced.

In some embodiments, there are a plurality of first locking portions 1011 and a plurality of second locking portions 2021. The plurality of second locking portions 2021 are in one-to-one correspondence with the plurality of first locking portions 1011, and each second locking portion 2021 separably locks with the corresponding first locking portion 1011.

Since the plurality of first locking portions 1011 and the plurality of second locking portions 2021 are on the first structural member 1 and the second structural member 2, respectively, and each second locking portion 2021 is locked with the corresponding first locking portion 1011, the connection area of the second structural member 2 and the first structural member 1 is larger with more connection points. As a result, the locking performance between the second structural member 2 and the first structural member 1 can be effectively improved, reducing or even eliminating the phenomenon that the first structural member 1 and/or the second structural member 2 are pushed up by compressed sealing members, electrically conductive members or grounding elastic sheets. Hence, the reliability and service performance of the terminal device having the locking assembly 100 is further enhanced.

In some embodiments, the locking assembly 100 further includes a sealing member 3 between the first structural member 1 and the second structural member 2. A locking fit is formed when each second locking portion 2021 is locked with the corresponding first locking portion 1011, and the locking fit is outside the sealing member 3.

Figure 4:
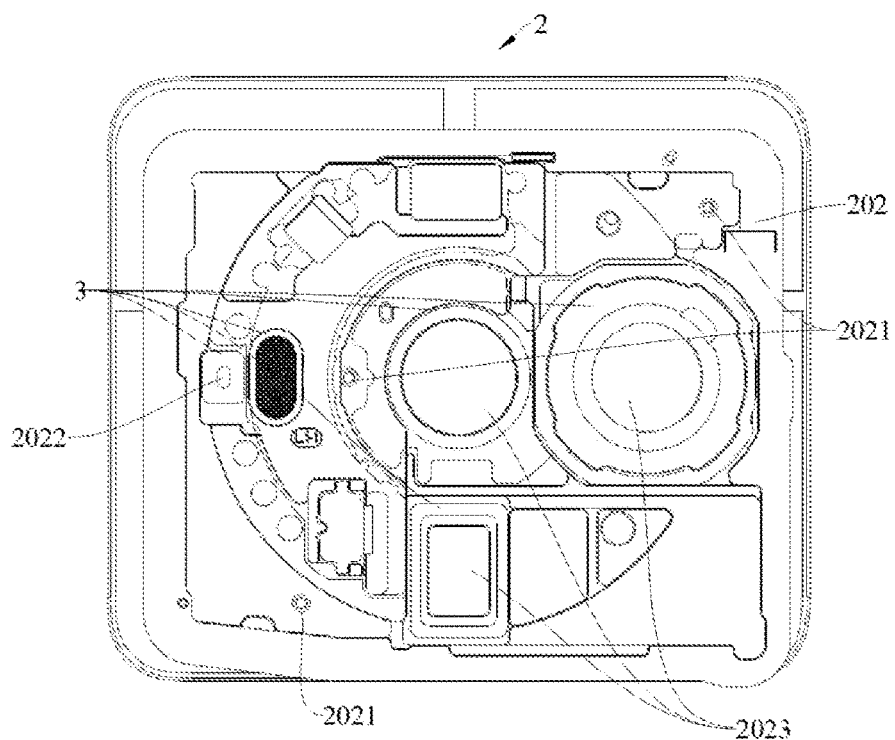
FIG. 4 is a plan view of a battery cover used with the locking assembly of FIG. 1, in embodiments.

For example, as shown in FIG. 4, the sealing member 3 is on the second structural member 2. The sealing member 3 is between the first structural member 1 and the second structural member 2 when the second structural member 2 is coupled to the first structural member 1.

Since the locking fit 8 formed when the second locking portion 2021 is locked with the first locking portion 1011 is outside the sealing member 3, interference between the locking fit 8 and components to be sealed (e.g., a camera, a flashlight, etc.) can be effectively avoided, which is conducive to further improving the reliability of the terminal device having the locking assembly 100.

In some embodiments, the sealing member 3 is an annular sealing foam.

In some embodiments, there are a plurality of sealing members 3, and at least one locking fit is between two adjacent sealing members 3.

The fact that at least one locking fit 8 is between two adjacent sealing members 3 can be understood in such a way that the second locking portion 2021 is between two adjacent sealing members 3 and the first locking portion 1011 is between two adjacent sealing members 3.

For example, as shown in FIG. 4, the second structural member 2 has a first light transmitting hole 2022 and a second light transmitting hole 2023, and the sealing members 3 surround both the first light transmitting hole 2022 and the second light transmitting hole 2023. The sealing member 3 around the first light transmitting hole 2022 acts as a flashlight sealing member, and the sealing member 3 around the second light transmitting hole 2023 acts as a camera sealing member. The at least one locking fit 8 between the two adjacent sealing members 3 is a middle locking fit, and one middle locking fit is between the flashlight sealing member and the camera sealing member.

Since the middle locking fit is between the two adjacent sealing members 3, the locking performance at the middle locking fit between the second structural member 2 and the first structural member 1 can be improved, effectively preventing the first structural member 1 and/or the second structural member 2 from being pushed up by the two compressed sealing members 3 near the middle locking fit.

Consequently, with the arrangement of at least one locking fit 8 between two adjacent sealing members 3, the first structural member 1 and/or the second structural member 2 can be more effectively prevented from being pushed up by the compressed sealing members 3, the sealing effect of the terminal device having the locking assembly 100 is further improved, and the reliability and service performance of the terminal device having the locking assembly 100 is enhanced.

In some embodiments, the second structural member 2 has the first light transmitting hole 2022 and the second light transmitting hole 2023. A part of the plurality of sealing members 3 surrounds the first light transmitting hole 2022, another part of the plurality of sealing members 3 surrounds the second light transmitting hole 2023, and at least one second locking portion 2021 is between the first light transmitting hole 2022 and the second light transmitting hole 2023.

Since the at least one second locking portion 2021 is between the first light transmitting hole 2022 and the second light transmitting hole 2023, the first structural member 1 and/or the second structural member 2 at the first light transmitting hole 2022 and the second light transmitting hole 2023 can be more effectively prevented from being pushed up by the compressed sealing members 3, the sealing effect at the first light transmitting hole 2022 and the second light transmitting hole 2023 is further improved, and the reliability and service performance of the terminal device having the locking assembly 100 is enhanced.

In some embodiments, the locking assembly 100 further includes a plurality of grounding elastic sheets 5 and a plurality of electrically conductive members 4. The grounding elastic sheets 5 and the electrically conductive members 4 are on the first structural member 1 and abut against the second structural member 2.

In some embodiments, at least one first locking portion 1011 is between two adjacent grounding elastic sheets 5.

It can be understood that the at least one first locking portion 1011 is between the two adjacent grounding elastic sheets 5, and correspondingly, the second locking portion 2021 fitted with the first locking portion 1011 is also between the two adjacent grounding elastic sheets 5. Moreover, the locking fit 8 formed by locking the first locking portion 1011 with the second locking portion 2021 is also between the two adjacent grounding elastic sheets 5.

Figure 3:
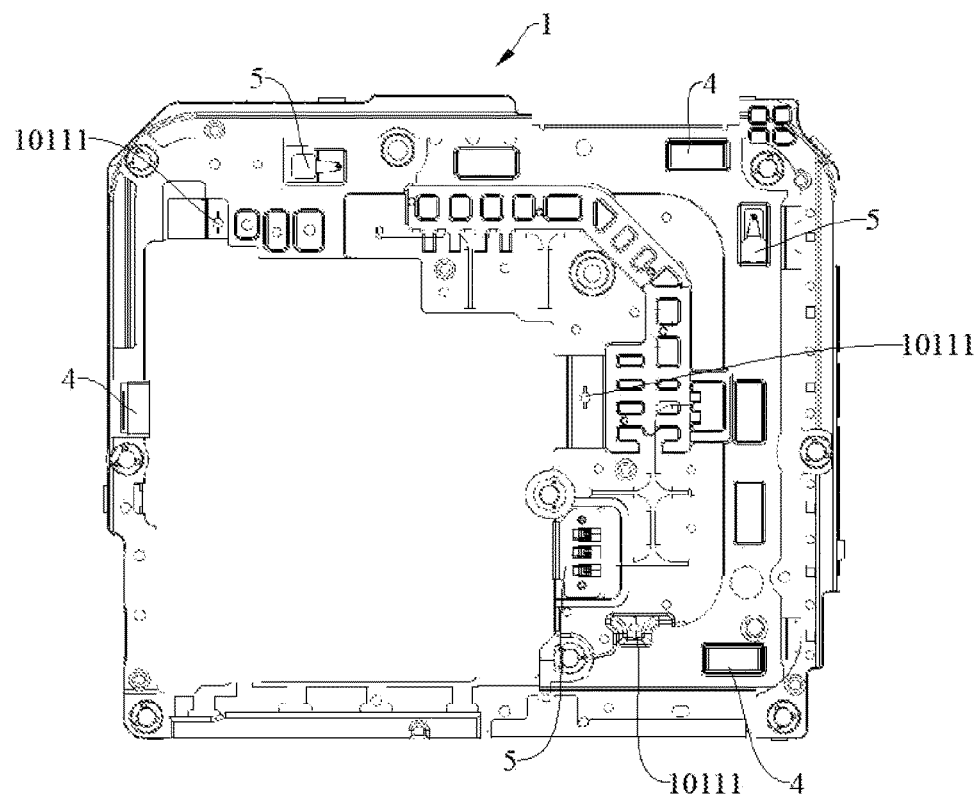
FIG. 3 is a plan view of an antenna support used with the locking assembly of FIG. 1, in embodiments.

For example, as shown in FIG. 3, connection lines of three grounding elastic sheets 5 exhibit a triangle, and one first locking portion 1011 is within the triangle.

Since the first locking portion 1011 is between two adjacent grounding elastic sheets 5, the locking performance at the first locking portion 1011 between the second structural member 2 and the first structural member 1 can be improved, and the first structural member 1 and/or the second structural member 2 can be more effectively prevented from being pushed up by the two compressed grounding elastic sheets 5 near the first locking portion 1011.

Consequently, with the arrangement of at least one first locking portion 1011 between two adjacent grounding elastic sheets 5, the first structural member 1 and/or the second structural member 2 can be more effectively prevented from being pushed up by the compressed grounding elastic sheets 5, the signal stability of the terminal device having the locking assembly 100 is further improved, and the reliability and service performance of the terminal device having the locking assembly 100 is enhanced.

In some embodiments, at least one first locking portion 1011 is between two adjacent electrically conductive members 4.

It can be understood that the at least one first locking portion 1011 is between the two adjacent electrically conductive members 4, and correspondingly, the second locking portion 2021 fitted with the first locking portion 1011 is also between the two adjacent electrically conductive members 4. Moreover, the locking fit 8 formed by locking the first locking portion 1011 with the second locking portion 2021 is also between the two adjacent electrically conductive members 4.

For example, as shown in FIG. 3, connection lines of three electrically conductive members 4 exhibit a triangle, and one first locking portion 1011 is within the triangle.

Since the first locking portion 1011 is between the two adjacent electrically conductive members 4, the locking performance at the first locking portion 1011 between the second structural member 2 and the first structural member 1 can be improved, and the first structural member 1 and/or the second structural member 2 can be more effectively prevented from being pushed up by the two compressed electrically conductive members 4 near the first locking portion 1011.

Consequently, with the arrangement of at least one first locking portion 1011 between two adjacent electrically conductive members 4, the first structural member 1 and/or the second structural member 2 can be more effectively prevented from being pushed up by the compressed electrically conductive members 4, the signal stability of the terminal device having the locking assembly 100 is further improved, and the reliability and service performance of the terminal device having the locking assembly 100 is enhanced.

In some embodiments, at least one first locking portion 1011 is between the grounding elastic sheet 5 and the electrically conductive member 4 adjacent to each other.

It can be understood that the first locking portion 1011 is between the ground elastic sheet 5 and the electrically conductive member 4 adjacent to each other, and correspondingly, the second locking portion 2021 fitted with the first locking portion 1011 is also between the ground elastic sheet 5 and the electrically conductive member 4 adjacent to each other. Moreover, the locking fit 8 formed by locking the first locking portion 1011 and the second locking portion 2021 is also between the ground elastic sheet 5 and the electrically conductive member 4 adjacent to each other.

For example, as shown in FIG. 3, one first locking portion 1011 is between the grounding elastic sheet 5 and the electrically conductive member 4 adjacent to each other.

Since the first locking portion 1011 is between the grounding elastic sheet 5 and the electrically conductive member 4 adjacent to each other, the locking performance at the first locking portion 1011 between the second structural member 2 and the first structural member 1 can be improved, and the first structural member 1 and/or the second structural member 2 can be more effectively prevented from being pushed up by the compressed grounding elastic sheet 5 and the compressed electrically conductive member 4 near the first locking portion 1011.

Consequently, with the arrangement of at least one first locking portion 1011 between the ground elastic sheet 5 and the electrically conductive member 4 adjacent to each other, the first structural member 1 and/or the second structural member 2 can be more effectively prevented from being pushed up by the compressed grounding elastic sheet 5 and the compressed electrically conductive member 4, the signal stability of the terminal device having the locking assembly 100 is further improved, and the reliability and service performance of the terminal device having the locking assembly 100 is enhanced.

In some embodiments, the second structural member 2 includes the battery cover, and the battery cover includes a cover body 201 and a camera trim 202 coupled to each other. The plurality of second locking portions 2021 are all on the cover body 201.

Due to a large area of the cover body 201, the arrangement of all the second locking portions 2021 on the cover body 201 facilitates the design and layout of the second locking portions 2021 on the cover body 201.

In some embodiments, the plurality of second locking portions 2021 are all on the camera trim 202.

It can be understood that there are many sealing members 3 at the camera trim 202, and the arrangement of all the second locking portions 2021 on the camera trim 202 more effectively prevents the second structural member 2 from being pushed up by the compressed sealing members 3, further improves the sealing effect of the terminal device having the locking assembly 100, and enhances the reliability and service performance of the terminal device having the locking assembly 100.

In some embodiments, the second structural member 2 includes the cover body 201 and the camera trim 202 coupled to each other. A part of the plurality of second locking portions 2021 is on the cover body 201, and another part of the plurality of second locking portions 2021 is on the camera trim 202.

Since a part of the second locking portions 2021 is on the cover body 201 and another part of the second locking portions 2021 is on the camera trim 202, it is convenient to flexibly select the position and the number of the second locking portions 2021 according to the internal structure of the terminal device.

In some embodiments, there are three or more first locking portions 1011 and three or more second locking portions 2021. At least three first locking portions 1011 are not on a same straight line. In other words, a connection line of the at least three first locking portions 1011 exhibits a triangle. Correspondingly, a connection line of at least three second locking portions 2021 exhibits a triangle.

Since the at least three first locking portions 1011 are not on the same straight line, the layout of the plurality of first locking portions 1011 can be more reasonable. Under a condition that the number of first locking portions 1011 is constant, the locking performance at various portions between the second structural member 2 and the first structural member 1 can be effectively improved, and the reliability and service performance of the terminal device having the locking assembly 100 is further enhanced.

In some embodiments, one of the first locking portion 1011 and the second locking portion 2021 includes a lock hole 10111, and the other of the first locking portion 1011 and the second locking portion 2021 includes a lock catch 2024. The lock catch 2024 is separably inserted in the lock hole 10111.

With the insertion fit between the lock catch 2024 and the lock hole 10111, the first locking portion 1011 and the second locking portion 2021 can be conveniently locked, facilitating the mounting of the terminal device having the locking assembly 100.

In some embodiments, the lock catch 2024 includes a lock head 20241 and a lock rod 20242 along an extension direction of the lock hole 10111, and an annular groove 20243 is formed between the lock head 20241 and the lock rod 20242. The lock head 20241 is configured to pass through the lock hole 10111, and a groove wall of the annular groove 20243 is separably fitted with a hole wall of the lock hole 10111, so that the second locking portion 2021 separably locks with the first locking portion 1011.

As shown in FIGS. 2, 6, 7 and 8, two end portions of the lock catch 2024 have large diameters; one end of the lock catch 2024 forms the lock head 20241; and the other end of the lock catch 2024 forms the lock rod 20242. The annular groove 20243 is between the lock head 20241 and the lock rod 20242. When the first locking portion 1011 is locked with the second locking portion 2021, the lock head 20241 passes through the lock hole 10111, and the groove wall of the annular groove 20243 is fitted with the hole wall of the lock hole 10111. Therefore, it is difficult for the lock head 20241 and the lock rod 20242 to pass through and move out of the lock hole 10111 when the first locking portion 1011 is locked with the second locking portion 2021, and the first locking portion 1011 can be effectively prevented from being separated from the second locking portion 2021.

Since the structure of the lock catch 2024 includes the lock head 20241 and the lock rod 20242, and the annular groove is formed between the lock head 20241 and the lock rod 20242, the separation between the first locking portion 1011 and the second locking portion 2021 fitted with each other can be effectively avoided, which is conducive to improving the locking reliability of the first locking portion 1011 and the second locking portion 2021, and further enhances the reliability of the terminal device having the locking assembly 100.

Figure 5:
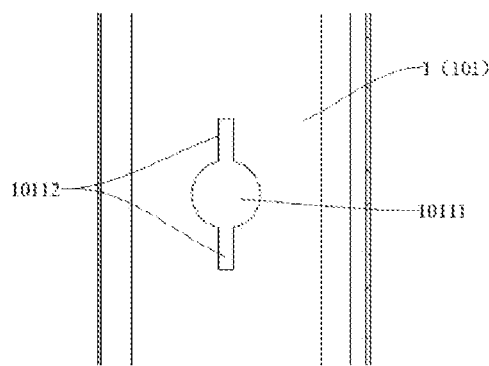
FIG. 5 is a schematic view of a first locking portion used with the battery cover of FIG. 4, in embodiments.

In some embodiments, as shown in FIGS. 3-5, the first locking portion 1011 further includes a deformation groove 10112 in communication with the lock hole 10111, and a groove wall of the deformation groove 10112 is elastically deformable, so that the groove wall of the annular groove 20243 is separably fitted with the hole wall of the lock hole 10111.

Due to the deformation groove 10112 in communication with the lock hole 10111, the elastic deformation of the groove wall of the deformation groove 10112 when the lock catch 2024 is fitted with the lock hole 10111 allows the lock head 20241 to pass through the lock hole 10111, facilitating the locking between the first locking portion 1011 and the second locking portion 2021. The elastic deformation of the groove wall of the deformation groove 10112 when the second structural member 2 is separated from the first structural member 1 allows the lock head 20241 to be moved out of the lock hole 10111, facilitating the separation of the second structural member 2 from the first structural member 1.

In some embodiments, there are a plurality of deformation grooves 10112 spaced apart from each other along a peripheral direction of the lock hole 10111.

For example, as shown in FIG. 5, two deformation grooves 10112 are opposite to each other.

The plurality of deformation grooves 10112 allows the lock head 20241 of the lock catch 2024 to pass through the lock hole 10111 more easily when the first locking portion 1011 needs to be locked or unlocked with the second locking portion 2021. Thus, the second structural member 2 can be locked with or separated from the first structural member 1 conveniently.

In some embodiments, a sectional area of the lock head 20241 first gradually increases and then gradually decreases in a direction approaching the lock rod 20242.

Figure 2:
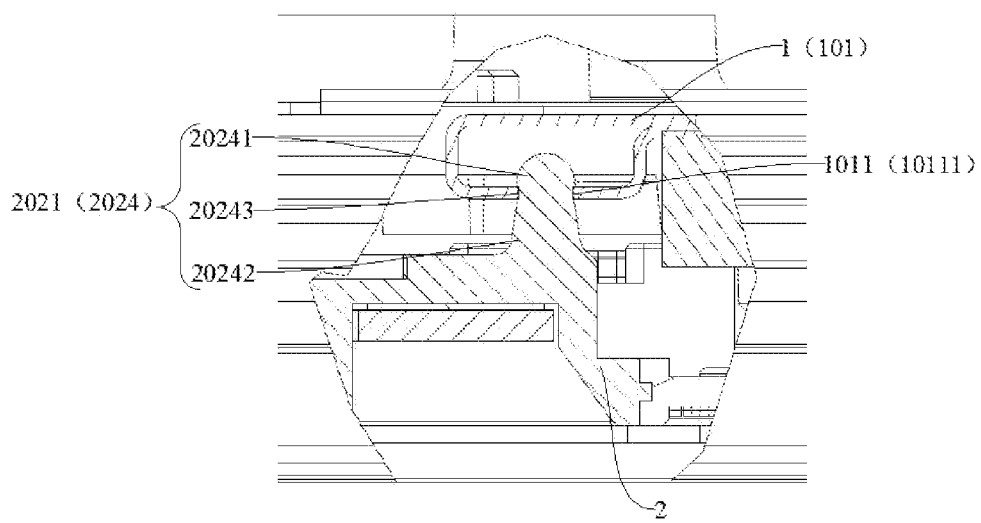
FIG. 2 is a cutaway cross-sectional view of a locking fit in FIG. 1, in embodiments.

For example, as shown in FIG. 2, the lock head 20241 is generally hemispherical.

When the second structural member 2 needs to be locked with (coupled to) the first structural member 1, i.e., the first locking portion 1011 needs to be locked with the second locking portion 2021, a peripheral surface of the lock head 20241 away from the lock rod 20242 plays a guiding role and makes it convenient for the lock head 20241 to pass through the lock hole 10111, and the annular groove 20243 is fitted with the hole wall of the lock hole 10111. When the second structural member 2 needs to be separated from the first structural member 1, a peripheral surface of the lock head 20241 close to the lock rod 20242 plays a guiding role and makes it convenient for the lock head 20241 to pass through the lock hole 10111, so that the lock catch 2024 is separated from the lock hole 10111.

Consequently, the design of the lock head 20241 makes it convenient for the lock catch 2024 to be locked with or separated from the lock hole 10111, facilitating the locking and separation between the second structural member 2 and the first structural member 1.

A sectional area of the lock rod 20242 gradually increases in a direction away from the lock head 20241.

For example, as shown in FIG. 2, the lock rod 20242 has a columnar shape with a gradually changing sectional area.

In some embodiments, the first locking portion 1011 includes the lock hole 10111 and the deformation groove 10112, i.e., the antenna support 101 has the lock hole 10111 and the deformation groove 10112. The second locking portion 2021 includes the lock catch 2024, and the lock catch 2024 is on the battery cover.

An accommodation space for accommodating the lock head 20241 may be formed between the antenna support 101 and a main board of the terminal device.

The arrangement of the first locking portion 1011 on the antenna support 101 can fully utilize the redundant space and structures inside the terminal device without affecting the original layout inside the terminal device, which is conducive to reducing the design cost of the terminal device and improving the structural compactness of the terminal device.

In some embodiments, the lock catch 2024 and the battery cover form an integral structure.

Since the lock catch 2024 and the battery cover are integrally formed, the stability of connection between the lock catch 2024 and the battery cover is improved, and the reliability of the terminal device having the locking assembly 100 is further enhanced.

In some embodiments, as shown in FIGS. 6 to 9, the locking assembly 100 further includes a lock hole component 6, and the lock hole component 6 includes a base 601 and a limiting member 602. The base 601 is coupled to one of the second structural member 2 and the first structural member 1. The base 601 has an avoidance opening 6011 and an accommodation groove 6012 in communication with the avoidance opening 6011. The avoidance opening 6011 is configured to avoid the lock catch 2024. The limiting member 602 is in the accommodation groove 6012 and defines the lock hole 10111.

Figure 6:
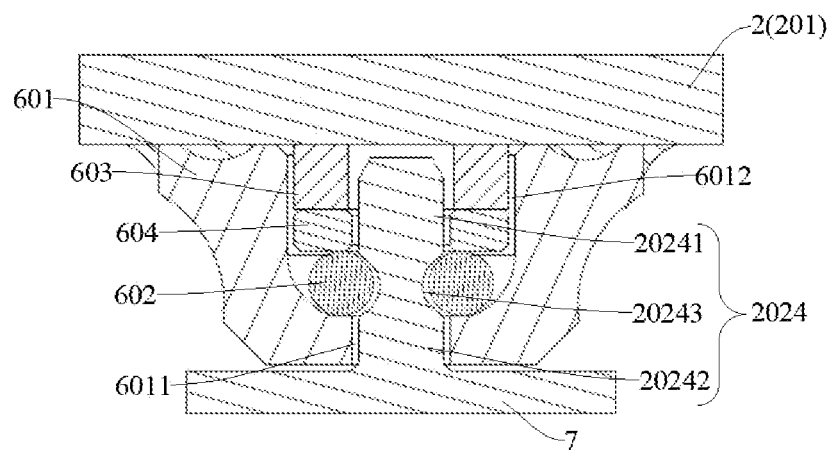
FIG. 6 is a cross-sectional view of a first locking portion and a second locking portion of a locking assembly in a locked state according to another embodiment of the present disclosure.
Figure 7:
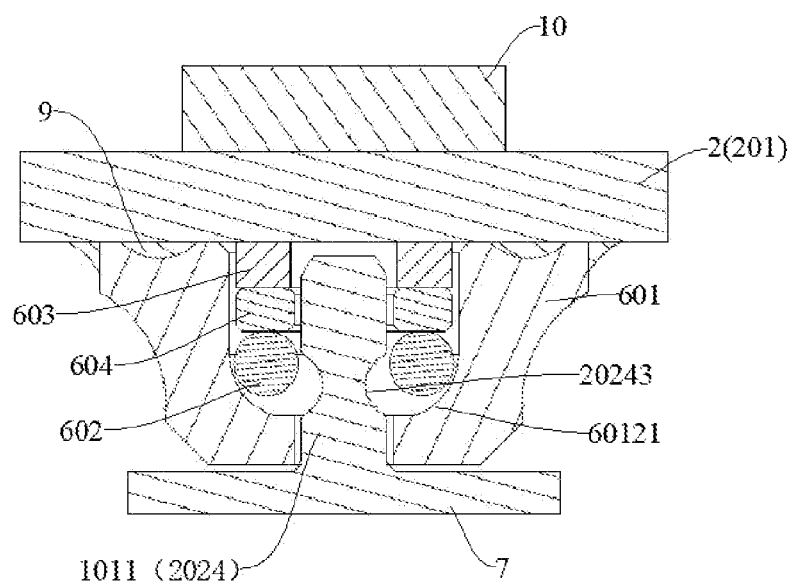
FIG. 7 is a cross-sectional view of a first locking portion and a second locking portion of a locking assembly in an unlocked state according to another embodiment of the present disclosure.
Figure 8:
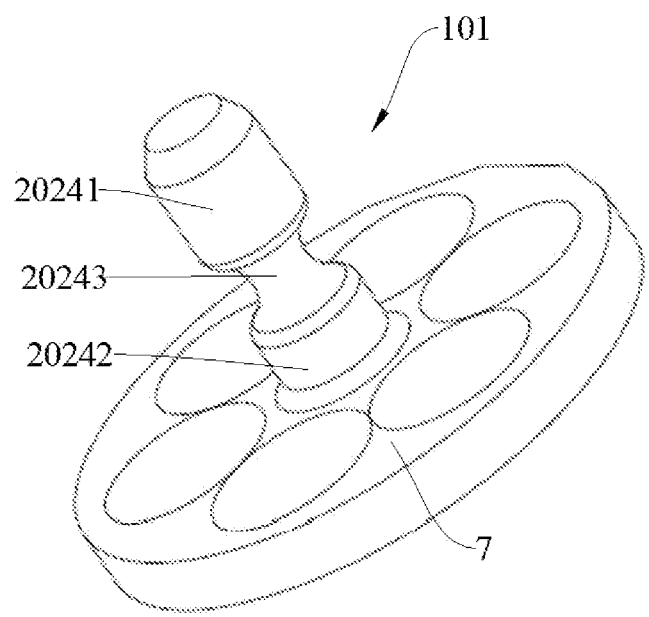
FIG. 8 is a perspective view of a first locking portion of FIG. 6, in embodiments.

For example, as shown in FIGS. 6 and 7, the base 601 is coupled to the second structural member 2, and the limiting member 602 defines the lock hole 10111.

Since the lock hole component 6 includes the base 601 and the limiting member 602, and the limiting member 602 defines the lock hole 10111, it is only necessary to couple the base 601 to the first structural member 1 or the second structural member 2 when the first structural member 1 or the second structural member 2 needs to have the lock hole 10111, and hence it is convenient for a designer to flexibly determine the position of the lock hole 10111 according to actual needs.

In some embodiments, the limiting member 602 includes a plurality of limiting portions, and the lock hole 10111 is defined among the plurality of limiting portions. The limiting member 602 is movable in an inner-outer direction, so that the lock hole component 6 may conveniently switch between a locked state and a separated state. The groove wall of the annular groove 20243 is configured to be fitted with the hole wall of the lock hole 10111 when the lock hole component 6 is in the locked state, so that the first structural member 1 is locked with the second structural member 2. The groove wall of the annular groove 20243 is configured to be separated from the hole wall of the lock hole 10111 when the lock hole component 6 is in the separated state, so that the first structural member 1 is separated from the second structural member 2.

The word "inner" refers to a side adjacent to a center line of the lock hole 10111 on a plane perpendicular to the center line of the lock hole 10111. The word "outer" refers to a side away from the center line of the lock hole 10111 on the plane perpendicular to the center line of the lock hole 10111.

Since the limiting member 602 is movable in the inner-outer direction, when the first structural member 1 needs to be locked with the second structural member 2, the limiting member 602 moves outward to switch the lock hole component 6 into the separated state, in which case the lock hole 10111 becomes larger and the lock head 20241 passes through the lock hole 10111. After the lock head 20241 passes through the lock hole 10111, the limiting member 602 moves inward to switch the lock hole component 6 into the locked state, in which case the lock hole 10111 becomes smaller, and the hole wall of the lock hole is fitted with the groove wall of the annular groove 20243, so that the first locking portion 1011 is locked with the second locking portion 2021 conveniently. When the second structural member 2 needs to be separated from the first structural member 1, the limiting member 602 moves outward to switch the lock hole component 6 into the separated state, in which case the lock hole 10111 becomes larger, and the lock head 20241 moves out of the lock hole 10111, so that the second structural member 2 is separated from the first structural member 1.

In some embodiments, the lock hole component 6 further includes an elastic member 603, and the elastic member 603 is in the accommodation groove 6012 and is configured to exert an inward elastic force on the limiting member 602, so that the lock hole component 6 switches from the separated state into the locked state.

The arrangement of elastic member 603 in the accommodation groove 6012 provides the inward elastic force for the limiting member 602. When the lock catch 2024 needs to be fitted with the lock hole 10111, the limiting member 602 may be moved outward against the elastic force of the elastic member 603 to switch the lock hole component 6 into the separated state. After the lock head 20241 passes through the lock hole 10111, the limiting member 602 is moved inward by the elastic force of the elastic member 603 to switch the lock hole component 6 from the separated state into the locked state, in which case the lock hole 10111 becomes smaller. When the second structural member 2 needs to be separated from the first structural member 1, the limiting member 602 may be moved outward against the elastic force of the elastic member 603 to switch the lock hole component 6 from the locked state into the separated state, in which case the lock hole 10111 becomes larger, and the lock head 20241 moves out of the lock hole 10111, realizing the separation of the second structural member 2 from the first structural member 1.

In some embodiments, the elastic member 603 is an elastic foam or a spring.

For example, the elastic member 603 is a compression spring.

The elastic member 603 is made of the elastic foam or spring as known in the art, which is conducive to saving the manufacturing cost of the lock hole component 6 and thus the cost of the locking assembly 100.

In some embodiments, the elastic member 603 and the limiting member 602 are along the extension direction of the lock hole 10111, and the elastic member 603 is configured to provide the limiting member 602 with an elastic force facing away from the elastic member 603. Apart of the groove wall of the accommodation groove 6012 forms a guide portion 60121, and the guide portion 60121 is gradually inclined outward along a direction from the limiting member 602 to the elastic member 603, so that the limiting member 602 is moved inward under an action of the elastic force of the elastic member 603.

For example, as shown in FIG. 7, the guide portion 60121 is formed on a bottom wall of the accommodation groove 6012 away from the elastic member 603. When the limiting member 602 is moved toward the elastic member 603 against the elastic force of the elastic member 603, the limiting member 602 is moved outward under the guidance of the guide portion 60121. When the limiting member 602 is moved away from the elastic member 603 under the action of elastic force of the elastic member 603, the limiting member 602 is moved inward under the guidance of the guide portion 60121.

Since the elastic member 603 and the limiting member 602 are along the extension direction of the lock hole 10111, and a part of the groove wall of the accommodation groove 6012 forms the guide portion 60121, the elastic member 603 and the limiting member 602 are arranged along the extension direction of the lock hole 10111 under a condition that the elastic member 603 is able to push the limiting member 602 to move in the inner-outer direction. As a result, a sectional area of the lock hole component 6 can be reduced, which avoids or even eliminates a phenomenon that the lock hole component 6 affects the original layout of the terminal device, and is conducive to reducing the design and manufacturing costs of the terminal device having the locking assembly 100.

In some embodiments, the accommodation groove 6012 has an annular shape, and the lock hole component 6 further includes a compression ring 604. The compression ring 604 is in the accommodation groove 6012 and between the limiting member 602 and the elastic member 603. The elastic member 603 provides the limiting member 602 with the elastic force facing away from the elastic member 603, through the compression ring 604.

The arrangement of the compression ring 604 between the limiting member 602 and the elastic member 603 allows the elastic force exerted on the compression ring 604 by the elastic member 603 to be simultaneously transmitted to the plurality of limiting portions of the limiting member 602 through the compression ring 604, and hence the plurality of limiting portions are moved inward synchronously.

Consequently, the reliability of the lock hole component 6 is improved, and the reliability of the locking between the first locking portion 1011 and the second locking portion 2021 is enhanced.

In some embodiments, the elastic member 603 has an annular shape.

In some embodiments, the lock head 20241 and the lock rod 20242 each have a cylindrical shape, and two ends of the lock head 20241 are chamfered.

When the second structural member 2 needs to be coupled to the first structural member 1, i.e., the first locking portion 1011 needs to be locked with the second locking portion 2021, a chamfer of the lock head 20241 away from the lock rod 20242 plays a guiding role and makes it convenient for the lock head 20241 to pass through the lock hole 10111, and the groove wall of the annular groove 20243 is fitted with the hole wall of the lock hole 10111. When the second structural member 2 needs to be separated from the first structural member 1, a chamfer of the lock head 20241 close to the lock rod 20242 plays a guiding role and makes it convenient for the lock head 20241 to pass through the lock hole 10111, so that the lock catch 2024 is separated from the lock hole 10111.

Consequently, the design of the lock head 20241 makes it convenient for the lock catch 2024 to be locked with or separated from the lock hole 10111, facilitating the locking and separation between the second structural member 2 and the first structural member 1.

In some embodiments, the first locking portion 1011 includes the lock catch 2024; the locking assembly 100 further includes a connection plate 7; the lock catch 2024 and the connection plate 7 form an integral structure; and the connection plate 7 is coupled to the antenna support 101. The second locking portion 2021 includes the lock hole 10111, and the base 601 is coupled to the battery cover.

A middle part of the compression ring 604 and a middle part of the elastic member 603 define the accommodation space for accommodating the lock head 20241.

The arrangement of the lock catch 2024 on the antenna support 101 can fully utilize the redundant space and structures inside the terminal device without affecting the original layout inside the terminal device, which is conducive to reducing the design cost of the terminal device and improving the structural compactness of the terminal device.

In some embodiments, the base 601 is bonded to the battery cover.

Figure 9:
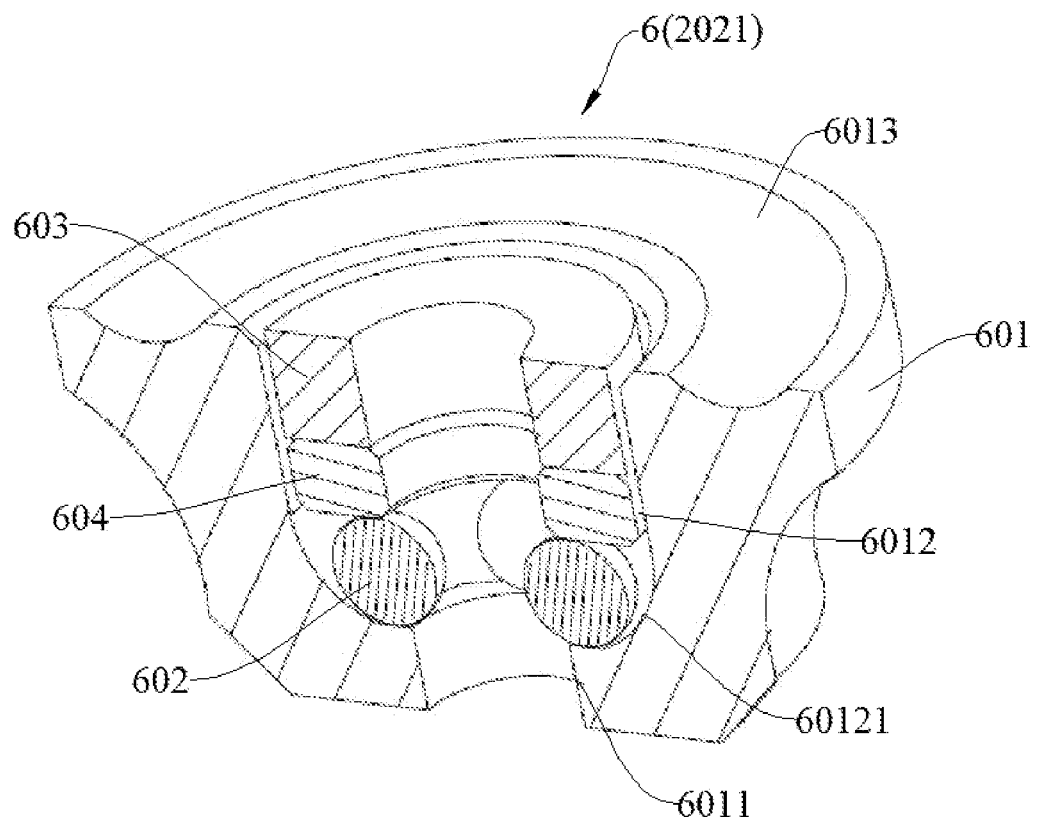
FIG. 9 is a cutaway perspective view of a second locking portion in FIG. 6, in embodiments.

For example, as shown in FIG. 9, an annular adhesive groove 6013 is at an end surface of the base 601 away from the limiting member 602, and the base 601 is bonded to the battery cover by an adhesive 9 in the adhesive groove 6013.

The base 601 is bonded to the battery cover, which not only facilitates the connection between the base 601 and the battery cover, but also realizes the reliable connection between the base 601 and the battery cover.

In some embodiments, the connection plate 7 is welded to a metal portion of the antenna support 101.

The connection plate 7 is welded to the metal portion of the antenna support 101, which is conducive to realizing the reliable connection between the lock catch 2024 and the antenna support 101.

In some embodiments, the limiting member 602 and the compression ring 604 are magnetically conductive members.

As shown in FIG. 7, since the limiting member 602 and the compression ring 604 are magnetically conductive members, when the second structural member 2 needs to be separated from the first structural member 1, it is only necessary to arrange a magnetic member on an outer side surface of the second structural member 2, so that the limiting member 602 and the compression ring 604 are attracted by the magnetic member 10 and move toward a direction approaching the second structural member 2. As a result, the plurality of limiting portions of the limiting member 602 move outward to switch the lock hole component 6 from the locked state into the separated state. At this time, the lock hole 10111 defined by the plurality of limiting portions becomes larger, and the lock head 20241 is easily moved out of the lock hole 10111, realizing the unlocking between the first locking portion 1011 and the second locking portion 2021.

Since the limiting member 602 and the compression ring 604 are magnetically conductive members, it is convenient to unlock the first locking portion 1011 and the second locking portion 2021, facilitating the separation of the second structural member 2 from the first structural member 1.

In some other embodiments, only the limiting member 602 is a magnetically conductive member.

Since the limiting member 602 is the magnetically conductive member, when the second structural member 2 needs to be separated from the first structural member 1, it is only necessary to arrange a magnetic member 10 on an outer side surface of the second structural member 2, so that the limiting member 602 is attracted by the magnetic member 10 and moves toward a direction approaching the second structural member 2. As a result, the plurality of limiting portions of the limiting member 602 move outward to switch the lock hole component 6 from the locked state into the separated state. At this time, the lock hole 10111 defined by the plurality of limiting portions becomes larger, and the lock head 20241 is easily moved out of the lock hole 10111, realizing the unlocking between the first locking portion 1011 and the second locking portion 2021.

Since the limiting member 602 is the magnetically conductive member, it is convenient to unlock the first locking portion 1011 and the second locking portion 2021, facilitating the separation of the second structural member 2 from the first structural member 1.

A terminal device according to embodiments of the present disclosure includes the locking assembly 100 according to any one of the above embodiments.

The terminal device may be a mobile phone, a tablet computer or a notebook computer.

The terminal device according to the embodiments of the present disclosure has advantages of reliability, good service performance and etc.

In the terminal device according to the embodiments of the present disclosure, the first locking portion 1011 and the second locking portion 2021 are on the first structural member 1 and the second structural member 2, respectively, so that the sealing reliability of the second structural member 2 is greatly enhanced, effectively ensuring the stable realization of the electrical connection and grounding requirements of the terminal device. In addition, a modular implementation of the lock hole component 6 is also provided. The designer can set the positions of the first locking portion 1011 and the second locking portion 2021 according to the actual internal structure and needs of the terminal device, and flexibly select specific structures, specific positions and quantities of the first locking portion 1011 and the second locking portion 2021, reducing the design requirement and the implementation cost, and ensuring the after-sales service quality of the terminal device.

In the description of the present disclosure, it shall be understood that terms such as "central," "longitudinal," "transverse," "length," "width," "thickness," "upper," "lower," "front," "rear," "left," "right," "vertical," "horizontal," "top," "bottom," "inner," "outer," "clockwise," "counterclockwise," "axial," "radial" and "peripheral" should be construed to refer to the orientation and position as then described or as shown in the drawings under discussion. These relative terms are only for convenience of description and do not indicate or imply that the device or element referred to must have a particular orientation, or be constructed and operated in a particular orientation. Thus, these terms shall not be construed as limitation on the present disclosure.

In addition, terms "first" and "second" are only used for descriptive purposes and cannot be understood as indicating or implying relative importance or implicitly indicating the number of indicated technical features. Thus, the features defined by "first" and "second" may include at least one of the features explicitly or implicitly. In the description of the present disclosure, "a plurality" of means at least two such as two or three, unless otherwise expressly and specifically defined.

In the present disclosure, unless otherwise expressly defined, terms such as "mounted," "connected," "coupled," and "fixed" shall be understood broadly, and may be, for example, fixed connections, detachable connections, or integral connections; may also be mechanical or electrical connections or intercommunication; may also be direct connections or indirect connections via intervening media; may also be inner communications or interactions of two elements. For those skilled in the art, the specific meaning of the above terms in the present disclosure can be understood according to the specific situations.

In the present disclosure, unless otherwise expressly defined and specified, a structure in which a first feature is "on" or "below" a second feature may include an embodiment in which the first feature is in direct contact with the second feature, or may further include an embodiment in which the first feature and the second feature are in indirect contact through intermediate media. Furthermore, a first feature "on," "above," or "on top of" a second feature may include an embodiment in which the first feature is right or obliquely "on," "above," or "on top of" the second feature, or just means that the first feature is at a height higher than that of the second feature, while a first feature "below," "under," or "on bottom of" a second feature may include an embodiment in which the first feature is right or obliquely "below," "under," or "on bottom of" the second feature, or just means that the first feature is at a height lower than that of the second feature.

In the description of the present disclosure, terms such as "an embodiment," "some embodiments," "an example," "a specific example," or "some examples," means that a particular feature, structure, material, or characteristic described in connection with the embodiment or example is included in at least one embodiment or example of the present disclosure. Thus, the appearances of these terms in various places throughout this specification are not necessarily referring to the same embodiment or example of the present disclosure. Furthermore, the particular features, structures, materials, or characteristics may be combined in any suitable manner in one or more embodiments or examples. In addition, without contradiction, those skilled in the art may combine and unite different embodiments or examples as well as features of the different embodiments or examples described in this specification.

Although the embodiments of the present disclosure have been shown and described above, it can be understood that the above embodiments are exemplary and shall not be understood as limitation on the present disclosure, and changes, modifications, alternatives and variations can be made in the above embodiments within the scope of the present disclosure by those skilled in the art.

What is claimed is:

1. A locking assembly, comprising:
a first structural member comprising a first locking portion; and
a second structural member comprising a second locking portion,
wherein the second locking portion is separably locked with the first locking portion, to lock the first structural member with the second structural member and separate the first structural member from the second structural member;
one of the first locking portion and the second locking portion comprises a lock hole, the other of the first locking portion and the second locking portion comprises a lock catch, and the lock catch is separably inserted in the lock hole;
the lock catch comprises a lock head and a lock rod along an extension direction of the lock hole when engaged, and an annular groove is formed between the lock head and the lock rod; and the lock head is configured to pass through the lock hole, a groove wall of the annular groove is separably fitted with a hole wall of the lock hole, and the second locking portion is separably locked with the first locking portion;
the first locking portion further comprises a deformation groove extended from and away the lock hole, a groove wall of the deformation groove is elastically deformable, and the groove wall of the annular groove is separably fitted with the hole wall of the lock hole;
a lock hole component, wherein the lock hole component comprises: a base coupled to one of the first structural member and the second structural member, and comprising an avoidance opening and an accommodation groove in communication with the avoidance opening, the avoidance opening being configured to avoid the lock catch; and a limiting member in the accommodation groove and defining the lock hole;
the limiting member comprises a plurality of limiting portions, the lock hole is defined among the plurality of limiting portions, and the limiting member is movable in an inner-outer direction to allow the lock hole component to switch between a locked state and a separated state; the groove wall of the annular groove is fitted with the hole wall of the lock hole in response to the locked state of the lock hole component, and the first structural member is locked with the second structural member; and the groove wall of the annular groove is separated from the hole wall of the lock hole in response to the separated state of the lock hole component, and the first structural member is separated from the second structural member;
the lock hole component further comprises an elastic member in the accommodation groove, the elastic member is configured to provide the limiting member with an inward elastic force, and the lock hole component switches from the separated state into the locked state; and
the limiting member and a compression ring are magnetically conductive members, and the limiting member and the compression ring are moved by the magnetic force to switch the lock hole component from the locked state into the separated state.

2. The locking assembly according to claim 1, wherein the first structural member comprises a body and a bracket coupled to the body, and the first locking portion is on the bracket.

3. The locking assembly according to claim 2, wherein:
the body comprises a middle frame, the bracket comprises an antenna support coupled to the middle frame, and the first locking portion is on the antenna support; and
the second structural member comprises a battery cover, and the second locking portion is on the battery cover.

4. The locking assembly according to claim 1, wherein there are a plurality of first locking portions and a plurality of second locking portions in one-to-one correspondence with the plurality of first locking portions, and each second locking portion is separably locked with a corresponding first locking portion.

5. The locking assembly according to claim 4, further comprising a sealing member between the first structural member and the second structural member, wherein a locking fit is formed when each second locking portion is locked with the corresponding first locking portion, and the locking fit is outside the sealing member.

6. The locking assembly according to claim 5, wherein:
there are a plurality of sealing members, and at least one locking fit is between two adjacent sealing members;
the second structural member comprises a first light transmitting hole and a second light transmitting hole, a part of the plurality of sealing members surrounding the first light transmitting hole, and another part of the plurality of sealing members surrounding the second light transmitting hole; and
at least one second locking portion is between the first light transmitting hole and the second light transmitting hole.

7. The locking assembly according to claim 4, further comprising a plurality of grounding elastic sheets and a plurality of electrically conductive members,
wherein:
the grounding elastic sheets and the electrically conductive members are on the first structural member and abut against the second structural member;
at least one first locking portion is at least one of (i) between two adjacent grounding elastic sheets, (ii) between two adjacent electrically conductive members, and (iii) between the grounding elastic sheet and the electrically conductive member adjacent to each other.

8. The locking assembly according to claim 4, wherein:
the second structural member comprises a battery cover, and the battery cover comprises a cover body and a camera trim coupled to each other;
the plurality of second locking portions are all on the cover body; or
the plurality of second locking portions are all on the camera trim; or
a part of the plurality of second locking portions is on the cover body, and another part of the plurality of second locking portions is on the camera trim.

9. The locking assembly according to claim 1, wherein the locking assembly satisfies at least one of:
(i) a sectional area of the lock head first gradually increases and then gradually decreases in a direction approaching the lock rod;
ii) a sectional area of the lock rod gradually increases in a direction away from the lock head; and
(iii) the first locking portion comprises the lock hole and the deformation groove, the first structural member comprises a body and a bracket coupled to the body, the body comprises a middle frame, the bracket comprises an antenna support coupled to the middle frame, and the antenna support comprises the lock hole and the deformation groove, the second locking portion comprises the lock catch, the second structural member comprises a battery cover, and the lock catch is on the battery cover.

10. The locking assembly according to claim 1, wherein:
the elastic member and the limiting member are along the extension direction of the lock hole, and the elastic member is configured to provide the limiting member with an elastic force facing away from the elastic member; and
a part of a groove wall of the accommodation groove forms a guide portion, and the guide portion is gradually inclined outward along a direction from the limiting member to the elastic member, to allow the limiting member to move inward under an action of the elastic force of the elastic member.

11. The locking assembly according to claim 10, wherein:
the accommodation groove has an annular shape;
the lock hole component further comprises the compression ring, and the compression ring is in the accommodation groove and between the limiting member and the elastic member; and
the elastic member provides the limiting member with the elastic force facing away from the elastic member, through the compression ring.

12. The locking assembly according to claim 1, wherein the locking assembly satisfies at least one of:
   (i) each of the lock head and the lock rod has a cylindrical shape, and two ends of the lock head are chamfered; and
   (ii) the first locking portion comprises the lock catch, the locking assembly further comprises a connection plate, the lock catch and the connection plate forms an integral structure, the first structural member comprises a body and a bracket coupled to the body, the body comprises a middle frame, the bracket comprises an antenna support coupled to the middle frame, and the connection plate is coupled to the antenna support, the second locking portion comprises the lock hole, and the second structural member comprises a battery cover coupled to the base.

13. A terminal device, comprising a locking assembly, wherein: the locking assembly comprises:
a first structural member comprising a first locking portion; and
a second structural member comprising a second locking portion,
wherein the second locking portion is separably locked with the first locking portion, to lock the first structural member with the second structural member and separate the first structural member from the second structural member; and
one of the first locking portion and the second locking portion comprises a lock hole, the other of the first locking portion and the second locking portion comprises a lock catch, and the lock catch is separably inserted in the lock hole;
the lock catch comprises a lock head and a lock rod along an extension direction of the lock hole when engaged, and an annular groove is formed between the lock head and the lock rod; and the lock head is configured to pass through the lock hole, a groove wall of the annular groove is separably fitted with a hole wall of the lock hole, and the second locking portion is separably locked with the first locking portion;
the first locking portion further comprises a deformation groove extended from and away the lock hole, a groove wall of the deformation groove is elastically deformable, and the groove wall of the annular groove is separably fitted with the hole wall of the lock hole;
a lock hole component, wherein the lock hole component comprises: a base coupled to one of the first structural member and the second structural member, and comprising an avoidance opening and an accommodation groove in communication with the avoidance opening, the avoidance opening being configured to avoid the lock catch; and a limiting member in the accommodation groove and defining the lock hole;
the limiting member comprises a plurality of limiting portions, the lock hole is defined among the plurality of limiting portions, and the limiting member is movable in an inner-outer direction to allow the lock hole component to switch between a locked state and a separated state; the groove wall of the annular groove is fitted with the hole wall of the lock hole in response to the locked state of the lock hole component, and the first structural member is locked with the second structural member; and the groove wall of the annular groove is separated from the hole wall of the lock hole in response to the separated state of the lock hole component, and the first structural member is separated from the second structural member;
the lock hole component further comprises an elastic member in the accommodation groove, the elastic member is configured to provide the limiting member with an inward elastic force, and the lock hole component switches from the separated state into the locked state; and
the limiting member and a compression ring are magnetically conductive members, and the limiting member and the compression ring are moved by the magnetic force to switch the lock hole component from the locked state into the separated state.

* * * * *